United States Patent
Park et al.

(10) Patent No.: US 9,172,019 B2
(45) Date of Patent: Oct. 27, 2015

(54) LIGHT EMITTING DEVICE PACKAGE AND METHOD OF MANUFACTURING THE SAME

(71) Applicant: SAMSUNG ELECTRONICS CO., LTD., Suwon-si (KR)

(72) Inventors: Myoung Bo Park, Suwon-si (KR); Ho Young Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 14/079,249

(22) Filed: Nov. 13, 2013

(65) Prior Publication Data

US 2014/0225139 A1 Aug. 14, 2014

(30) Foreign Application Priority Data

Feb. 14, 2013 (KR) ........................ 10-2013-0015839

(51) Int. Cl.
*H01L 33/36* (2010.01)
*H01L 33/62* (2010.01)
(Continued)

(52) U.S. Cl.
CPC .............. *H01L 33/62* (2013.01); *H01L 33/005* (2013.01); *H01L 33/0008* (2013.01); *H01L 33/0033* (2013.01); *H01L 33/0041* (2013.01); *H01L 33/48* (2013.01); *H01L 33/483* (2013.01); *H01L 33/486* (2013.01); *H01L 33/50* (2013.01); *H01L 33/501* (2013.01); *H01L 33/502* (2013.01); *H01L 33/505* (2013.01); *H01L 33/52* (2013.01); *H01L 33/54* (2013.01); *H01L 33/56* (2013.01); *H01L 33/58* (2013.01); *H01L 33/60* (2013.01); *H01L 33/642* (2013.01); *H01L 33/382* (2013.01); *H01L 2224/48091* (2013.01); *H01L 2224/48247* (2013.01); *H01L 2224/73265* (2013.01); *H01L 2933/005* (2013.01); *H01L 2933/0008* (2013.01);
(Continued)

(58) Field of Classification Search
CPC ....... H01L 33/62; H01L 33/642; H01L 33/52; H01L 33/54; H01L 33/56; H01L 33/58; H01L 33/60; H01L 33/50; H01L 33/501; H01L 33/502; H01L 33/505; H01L 33/507; H01L 33/48; H01L 33/483; H01L 33/486; H01L 33/005; H01L 2933/0008; H01L 2933/0033
See application file for complete search history.

(56) References Cited

U.S. PATENT DOCUMENTS

| | | | |
|---|---|---|---|
| 7,964,943 | B2 | 6/2011 | Seo et al. |
| 2005/0199884 | A1 | 9/2005 | Lee et al. |

(Continued)

FOREIGN PATENT DOCUMENTS

| | | | |
|---|---|---|---|
| JP | 2002270901 | A | 9/2002 |
| JP | 2004134414 | A | 4/2004 |

(Continued)

*Primary Examiner* — Fei Fei Yeung Lopez
(74) *Attorney, Agent, or Firm* — Sughrue Mion, PLLC

(57) ABSTRACT

A light emitting device package includes a frame unit including at least two lead frames spaced apart from one another and a light emitting region defined by a distance between the two lead frames; a light emitting device mounted on a surface of the frame unit such that the light emitting device is positioned across the light emitting region, and electrically connected to the lead frames; a wavelength conversion unit provided in the light emitting region, and configured to convert a wavelength of light emitted from the light emitting device and emit the light having the converted wavelength; and a reflective molding unit formed on the surface of the frame unit to cover the light emitting device.

17 Claims, 11 Drawing Sheets

(51) Int. Cl.
*H01L 33/50* (2010.01)
*H01L 33/00* (2010.01)
*H01L 33/48* (2010.01)
*H01L 33/64* (2010.01)
*H01L 33/52* (2010.01)
*H01L 33/54* (2010.01)
*H01L 33/58* (2010.01)
*H01L 33/60* (2010.01)
*H01L 33/56* (2010.01)
*H01L 33/38* (2010.01)

(52) U.S. Cl.
CPC .............. *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 2006/0124946 A1* | 6/2006 | Fujita | 257/98 |
| 2011/0199787 A1* | 8/2011 | Kim et al. | 362/612 |
| 2012/0138974 A1* | 6/2012 | Yoo et al. | 257/88 |

FOREIGN PATENT DOCUMENTS

| | | |
|---|---|---|
| JP | 2004235418 A | 8/2004 |
| KR | 1020040031882 A | 4/2004 |
| KR | 1020090072969 A | 7/2009 |

* cited by examiner

LIGHT EMITTING DEVICE PACKAGE AND METHOD OF MANUFACTURING THE SAME

CROSS-REFERENCE TO RELATED APPLICATIONS

This application claims priority from Korean Patent Application No. 10-2013-0015839, filed on Feb. 14, 2013 in the Korean Intellectual Property Office, the disclosure of which is incorporated by reference herein in its entirety.

BACKGROUND

1. Field

Devices, methods, and articles of manufacture consistent with exemplary embodiments relate to a light emitting device package and a method of manufacturing the same.

2. Description of the Related Art

A related art side-view type light emitting device package, of which a light emitting surface is disposed to be perpendicular to a board, includes an electrode pad disposed on a lateral surface of the package mounted on the board. To this end, an array of complicated processes of exposing a lead frame electrically connected to a light emitting device from a lateral surface of a package body and bending the exposed lead frame must be performed. Thus, the ability of reduce a package size and manufacturing costs is limited.

In addition, in filling a reflective cup, in which a light emitting device is installed, with resin containing phosphors through a dispensing process, it is difficult to uniformly inject a predetermined amount of resin repeatedly to maintain and manage a predetermined thickness of the light emitting device. In particular, it is difficult to maintain a phosphor layer having a uniform thickness, which in turn has disadvantageous affects on color coordinate dispersion performance.

SUMMARY

Exemplary embodiments provide a light emitting device package having a simple structure, incurring low manufacturing costs, and having a phosphor layer having a uniform thickness, and a manufacturing method thereof.

According to an aspect of an exemplary embodiment, there is provided a light emitting device package including a frame unit that includes at least two lead frames spaced apart from one another and a light emitting region defined by a distance therebetween; a light emitting device that is mounted on a surface of the frame unit such that the light emitting device is positioned across the light emitting region, and that is electrically connected to the at least two lead frames; a wavelength conversion unit configured to convert a wavelength of light emitted from the light emitting device and emit the light having the converted wavelength externally; and a reflective molding unit that is formed on the surface of the frame unit to cover the light emitting device.

The wavelength conversion unit may be provided in the light emitting region and may be formed to be parallel to the surface of the frame unit and to another surface of the frame unit opposed to the surface of the frame unit.

The reflective molding unit may be made of a resin including a reflective material.

An outer surface of the reflective molding unit may be coplanar with a circumferential surface of the frame unit.

An inner surface, that faces the light emitting region, of each of the at least two lead frames may be sloped away from the light emitting region from the surface on which the light emitting device is mounted to another surface opposed to the surface.

The frame unit may further include a mounting recess that is formed in each of the at least two lead frames, the mounting recess being depressed into the lead frame and the light emitting device being mounted to the mounting recesses.

Each of the at least two lead frames may include an extended frame portion that extends from the lead frame in an extending direction.

The extended frame portions may be disposed to be parallel to each other with the light emitting device interposed therebetween, and the extended frame portions are not in contact with other lead frames positioned in the extending direction.

The extended frame portions may extend parallel to each other and each of the extended frame portions may have an end portion that extends further than a width of the light emitting device interposed therebetween, and each lead frame may further include a recess that accommodates the end portion of another lead frame that extends parallel thereto.

The end portion of each lead frame is bent toward the recess of the another lead frame that extends parallel thereto, and a portion of each recess comprises electrical insulation.

According to an aspect of another exemplary embodiment, there is provided a method for manufacturing a light emitting device package, the method including preparing a base frame in which a plurality of frame units are arranged, each of the frame units including a first lead frame and a second lead frame that is spaced apart from the first lead frame; attaching a temporary fixing film to a lower surface of the base frame; forming a wavelength conversion unit in a light emitting region defined by a distance between the first lead frames and the second lead frames; mounting a light emitting device across the light emitting region of each frame unit, the light emitting device being mounted on portions of a surface of each of the first lead frame and the second lead frame; and forming a reflective molding unit on each frame unit to cover the light emitting device.

The forming of the wavelength conversion unit may include filling each light emitting region with a resin containing phosphors.

The forming of the reflective molding unit may include injecting a resin comprising a reflective material onto the base frame to cover the light emitting device, and curing the resin.

The method may further include removing the temporary fixing film after forming the wavelength conversion unit.

The method may further include dicing the base frame into frame units.

According to an aspect of another exemplary embodiment, there is provided a light emitting device package including a first lead frame; a second lead frame spaced apart from the first lead frame to form a light emitting region in a gap therebetween; a light emitting device that is mounted and electrically connected to the first lead frame and to the second lead frame such that the light emitting device is positioned across the light emitting region; a wavelength conversion unit that is formed in the light emitting region and that converts a wavelength of light emitted from the light emitting device and emits the light having the converted wavelength; and a reflective molding unit that is formed on the first lead frame and the second lead frame to cover the light emitting device.

BRIEF DESCRIPTION OF THE DRAWINGS

The above and other aspects will be more clearly understood from the following detailed description taken in conjunction with the accompanying drawings, in which.

DETAILED DESCRIPTION OF EXEMPLARY EMBODIMENTS

Figure 1:
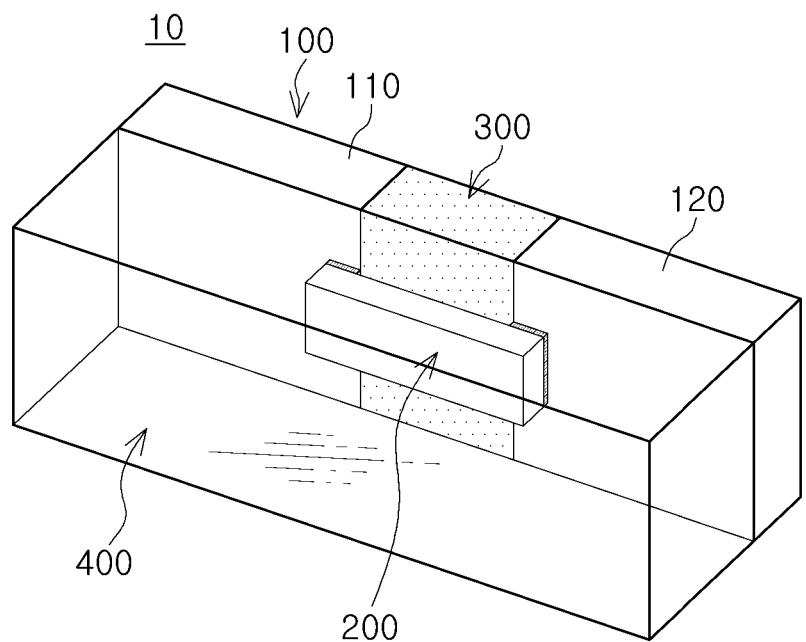
FIG. 1 is a perspective view schematically illustrating a light emitting device package according to an exemplary embodiment.

Embodiments of the present inventive concept will now be described in detail with reference to the accompanying drawings. The inventive concept may, however, be embodied in many different forms and should not be construed as being limited to the embodiments set forth herein. Rather, these embodiments are provided so that this disclosure will be thorough and complete, and will fully convey the scope of the inventive concept to those skilled in the art. In the drawings, the shapes and dimensions of elements may be exaggerated for clarity, and the same reference numerals will be used throughout to designate the same or like components.

Figure 2:
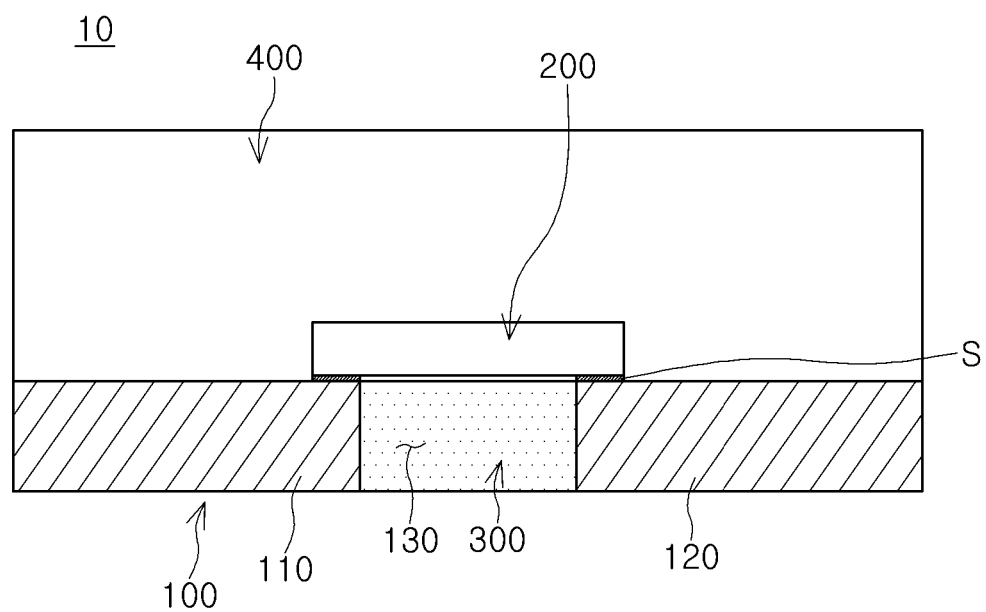
FIG. 2 is a cross-sectional view of the light emitting device package of FIG. 1.
Figure 3:
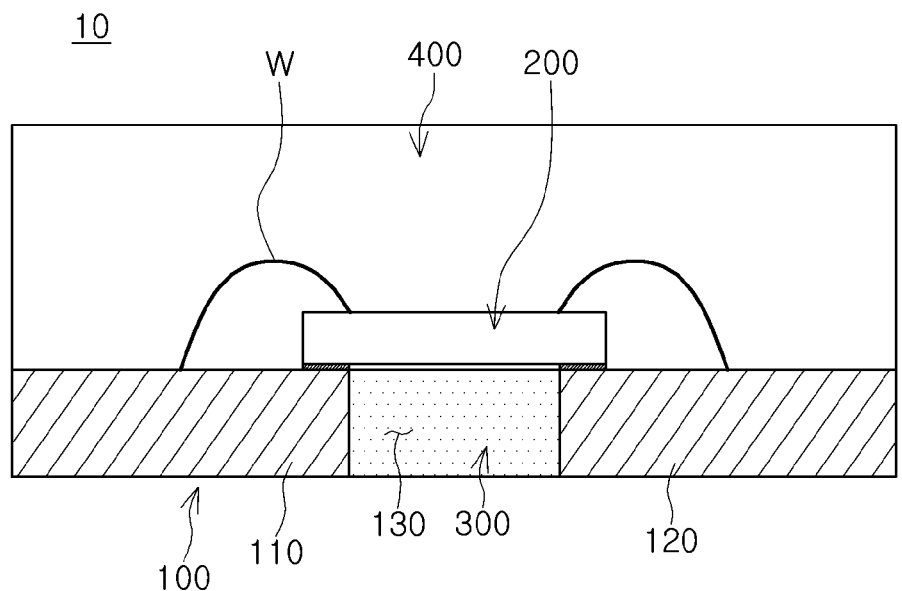
FIG. 3 is a modification of the light emitting device package of FIG. 2.

A light emitting device package according to an exemplary embodiment will be described in detail with reference to FIGS. 1 through 3. FIG. 1 is a perspective view schematically illustrating a light emitting device package according to an exemplary embodiment. FIG. 2 is a cross-sectional view of the light emitting device package of FIG. 1. FIG. 3 is a modification of the light emitting device package of FIG. 2;

Referring to FIGS. 1 through 3, a light emitting device package 10 may include a frame unit 100, a light emitting device 200, a wavelength conversion unit 300, and a reflective molding unit 400.

The frame unit 100, a type of support member supporting the light emitting device 200 as described hereinafter, may include at least one pair of lead frames 110 and 120 facing one another. The pair of lead frames may include a first lead frame 110 and a second lead frame 120 and may be spaced apart from one another with an interval therebetween and connected to electrodes having different polarities, respectively. The interval may be predetermined. The frame unit 100 may have a light emitting region 130 defined by a distance (or space) between the pair of lead frames 110 and 120. That is, the light emitting region 130 may be in the interval.

The frame unit 100 may be made of a material having electrical conductivity. For example, the frame unit 100 may be made of metal such as aluminum (Al), copper (Cu), iron (Fe), or the like, or an alloy. In the present exemplary embodiment, it is illustrated that the frame unit 100 has a plate structure made of metal, but the present exemplary embodiment is not limited thereto. For example, the frame unit 100 may be an FR4 type printed circuit board (PCB), may be made of an organic resin material containing epoxy, triazine, silicon, and the like, or any other organic resin material, may be made of a ceramic material such as silicon nitride, AlN, $Al_2O_3$, or the like, or may include a metal-core printed circuit board (MCPCB), or the like.

The light emitting device 200 may be mounted on and supported by the frame unit 100, and may be electrically connected thereto. In detail, the light emitting device 200 may be mounted on portions of the first lead frame 110 and the second lead frame 120 across the light emitting region 130. See, for example, FIG. 1 where the light emitting device 200 is mounted on a portion of the first lead frame 110 and a portion of the second lead frame 120. While FIGS. 1-3 show the light emitting device 200 generally centered across the interval, the present exemplary embodiment is not limited to this, and the light emitting device 200 may be skewed more to one side than the other. For example, the portion of the first lead frame 110 that is covered by the light emitting device 200 may be more than the portion of the second lead frame 120 that is covered by the light emitting device 200, or vice versa.

The light emitting device 200 may be mounted on the frame unit 100 according to a flip-chip bonding scheme through solder (S) and electrically connected thereto. Also, as illustrated in FIG. 3, the light emitting device 200 may be mounted on and supported by the frame unit 100 and may be electrically connected to the frame unit 100 according to a wire bonding scheme through wires W.

The light emitting device 200, a type of semiconductor device that generates light having a predetermined wavelength by external power applied from the outside, may include a light emitting diode (LED) chip. The light emitting device 200 may emit blue light, green light, or red light according to a material contained therein, or may emit white light. It should be noted that the color or type of light is not particularly limited.

Hereinafter, various light emitting devices that may be employed in a light emitting device package according to an exemplary embodiment will be described.

Light Emitting Device

First Example

Figure 4:
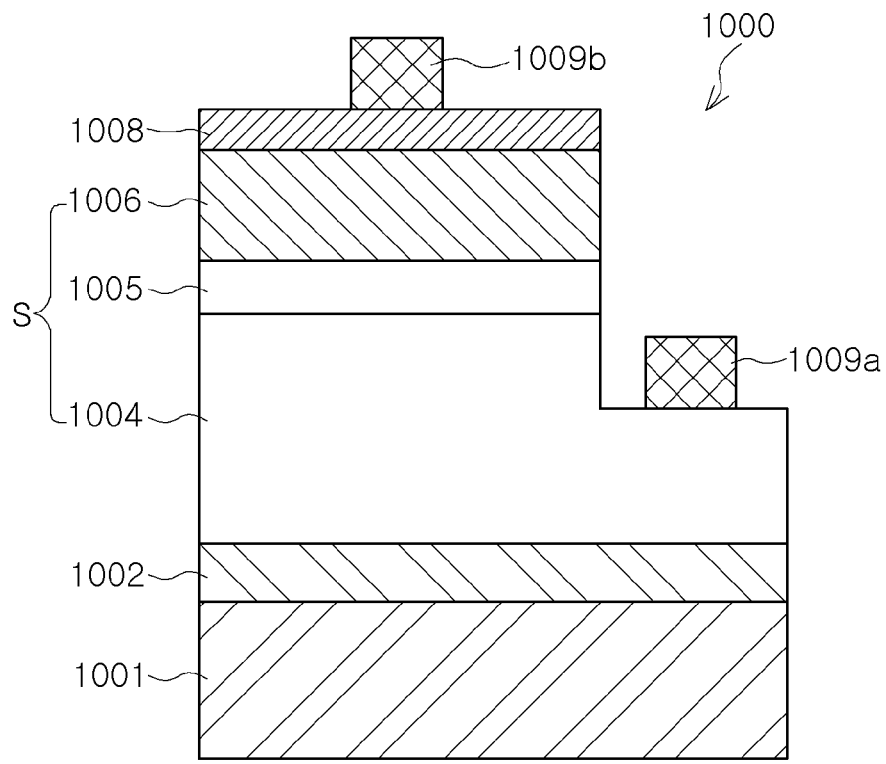
FIG. 4 is a cross-sectional view illustrating an example of a light emitting diode (LED) chip that can be employed in an exemplary embodiment.

FIG. 4 is a cross-sectional view illustrating an example of the light emitting device (an LED chip).

As illustrated in FIG. 4, a light emitting device 1000 may include a light emitting laminate S formed on a substrate 1001. The light emitting laminate S may include a first conductive semiconductor layer 1004, an active layer 1005, and a second conductive semiconductor layer 1006.

An ohmic-contact layer 1008 may be formed on the second conductive semiconductor layer 1006, and first electrode 1009a and second electrode 1009b may be formed on upper surfaces of the first conductive semiconductor layer 1004 and the ohmic-contact layer 1008, respectively.

In the present disclosure, the meaning of the terms such as 'upper portion', 'upper surface', 'lower portion', 'lower surface', 'lateral surface', and the like, are determined based on the drawings. However, in an actual embodiment, the meaning of the terms may be changed according to a direction in which a light emitting device is disposed.

Hereinafter, components of the light emitting device will be described.

[Substrate]

As the substrate 1001, an insulating substrate, a conductive substrate, or a semiconductor substrate may be used. For example, sapphire, SiC, Si, $MgAl_2O_4$, MgO, $LiAlO_2$, $LiGaO_2$, or GaN may be used as a material of the substrate 1001. For epitaxial growth of a GaN material, a GaN substrate, a homogeneous substrate, may be desirable, but a homogeneous substrate has high production costs due to difficulties in the manufacturing thereof.

As a heterogeneous substrate, a sapphire substrate, a silicon carbide substrate, or the like, may be used, and in this case, a sapphire substrate is relatively more utilized than the more costly silicon carbide substrate. When a heterogeneous substrate is used, defects such as dislocation, and the like, are increased due to differences in lattice constants between a substrate material and a thin film material. Also, differences in coefficients of thermal expansion between the substrate material and the thin film material may cause bowing due to changing temperatures, and the bowing may cause cracks in the thin film. This bowing may be reduced by using a buffer layer 1002 between the substrate 1001 and the light emitting laminate S based on GaN.

The substrate 1001 may be fully or partially removed or patterned during a chip manufacturing process in order to enhance optical or electrical characteristics of the LED chip before or after the LED structure is grown.

For example, a sapphire substrate may be separated by irradiating a laser onto the interface between the substrate and a semiconductor layer through the substrate, and a silicon substrate or a silicon carbide substrate may be removed through a method such as polishing/etching, or the like.

In removing the substrate, a support substrate may be used, and in this case, in order to enhance luminance efficiency of an LED chip in the opposite side of the original growth substrate, the support substrate may be bonded by using a reflective metal, or a reflective structure may be inserted into the center of a junction layer.

Substrate patterning forms a concavo-convex surface or a sloped surface on a main surface (a surface or both sides) or lateral surfaces of a substrate before or after the growth of an LED structure, enhancing light extraction efficiency. A pattern size may be selected within the range from about 5 nm to about 500 μm. The substrate may have a regular or irregular pattern to enhance light extraction efficiency. The substrate may have various shapes such as a columnar shape, a mountain-valley shape, a hemispherical shape, and the like.

Here, the sapphire substrate may be a crystal having Hexa-Rhombo R3c symmetry, of which lattice constants in c-axial and a-axial directions are approximately 13.001 Å and approximately 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate.

The substrate 1001 may also be made of silicon (Si). Since a silicon (Si) substrate is more appropriate for increasing a diameter and is relatively low in price, an Si substrate may be used to facilitate mass-production. A technique of inducing a difference in lattice constants between the silicon substrate having (111) plane as a substrate surface and GaN to a 17% degree to thereby suppress the generation of crystal defects due to the difference between the lattice constants is used. Also, a difference in coefficients of thermal expansion between silicon and GaN is approximately 56%, and thus a technique of suppressing bowing of a wafer generated due to the difference in the coefficients of thermal expansion is used. Bowed wafers may result in cracks in the GaN thin film and make it difficult to control processes to increase dispersion of emission wavelengths (or excitation wavelengths) of light in the same wafer, or the like.

The silicon substrate absorbs light generated in the GaN-based semiconductor, lowering external quantum yield of the light emitting device. Thus, the substrate may be removed and a support substrate such as a silicon substrate, a germanium substrate, an SiAl substrate, a ceramic substrate, a metal substrate, or the like, including a reflective layer may be additionally formed to be used.

[Buffer Layer]

When a GaN thin film is grown on a heterogeneous substrate such as the silicon substrate, dislocation density may be increased due to a lattice constant mismatch between a substrate material and a thin film material, and cracks and warpage (or bowing) may be generated due to a difference between coefficients of thermal expansion. In order to prevent dislocation of and cracks in the light emitting laminate S, the buffer layer 1002 may be disposed between the substrate 1001 and the light emitting laminate S. The buffer layer 1002 may serve to adjust a degree of warpage of the substrate when an active layer is grown, to reduce a wavelength dispersion of a wafer.

The buffer layer 1002 may be made of $Al_xIn_yGa_{1-x-y}N$ ($0 \leq x \leq 1$, $0 \leq y \leq 1$, $0 \leq x+y \leq 1$), in particular, GaN, AlN, AlGaN, InGaN, or InGaNAlN, and a material such as $ZrB_2$, $HfB_2$, ZrN, HfN, TiN, or the like, may also be used. Also, the buffer layer may be formed by combining a plurality of layers or by gradually changing a composition.

A silicon (Si) substrate has a coefficient of thermal expansion significantly different from that of GaN. Thus, in case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress.

A difference in the lattice constants between silicon (Si) and GaN involves a high possibility of a defect being generated therein. In the case of a silicon substrate, a buffer layer having a composite structure may be used in order to control stress for restraining warpage (or bowing) as well as controlling a defect.

For example, first, an AlN layer may be formed on the substrate 1001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from about 400° C. to about 1,300° C. by using an aluminum (Al) source and a nitrogen (N) source. An AlGaN interlayer may be used to control stress. For example, in the case of AlN/AlGaN buffer layer, AlGaN interlayer may be inserted between the buffer layer and GaN layer and controls stress.

[Light Emitting Laminate]

The light emitting laminate S having a multilayer structure of a Group III nitride semiconductor will be described in detail. The first conductive semiconductor layer 1004 and the second conductive semiconductor layer 1006 may be formed of n-type and p-type impurity-doped semiconductors, respectively.

However, the present inventive concept is not limited thereto and, conversely, the first conductive semiconductor layer 1004 and the second conductive semiconductor layer 1006 may be formed of p-type and n-type impurity-doped semiconductors, respectively. For example, the first conductive semiconductor layer 1004 and the second conductive semiconductor layer 1006 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). Of course, the present exemplary embodiment is not limited thereto and the first conductive semiconductor layer 1004 and the second conductive semiconductor layer 1006 may also be made of a material such as an AlGaInP-based semiconductor or an AlGaAs-based semiconductor.

The first conductive semiconductor layer 1004 and the second conductive semiconductor layer 1006 may have a unilayer structure, or, alternatively, the first conductive semiconductor layer 1004 and the second conductive semiconductor layer 1006 may have a multilayer structure including layers having different compositions, thicknesses, and the like. For example, the first conductive semiconductor layer 1004 and the second conductive semiconductor layer 1006 may have a carrier injection layer for improving electron and hole injection efficiency, or may have various types of superlattice structure, respectively.

The first conductive semiconductor layer 1004 may further include a current spreading layer (not shown) in a region adjacent to the active layer 1005. The current spreading layer may have a structure in which a plurality of $In_xAl_yGa_{(1-x-y)}N$ layers having different compositions or different impurity contents are iteratively laminated or may have an insulating material layer partially formed therein.

The second conductive semiconductor layer 1006 may further include an electron blocking layer in a region adjacent to the active layer 1005. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 1005, thus preventing electrons from being transferred to the second conductive (p-type) semiconductor layer 1006.

The light emitting laminate S may be formed by using metal-organic chemical vapor deposition (MOCVD) apparatus. In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 1001 is installed as reactive gases, the substrate being maintained at a high temperature ranging from about 900° C. to about 1,100° C., and while a gallium nitride-based compound semiconductor is being grown, an impurity gas may be supplied to laminate the gallium nitride-based compound semiconductor as an undoped n-type or p-type semiconductor. Silicon (Si) is a well known n-type impurity and p-type impurity includes zinc (Zn), cadmium (Cd), beryllium (Be), magnesium (Mg), calcium (Ca), barium (Ba), and the like. Among them, magnesium (Mg) and zinc (Zn) may be mainly used.

Also, the active layer 1005 disposed between the first conductive semiconductor layer 1004 and the second conductive semiconductor layer 1006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic-Contact Layer and First and Second Electrodes]

The ohmic-contact layer 1008 may have a relatively high impurity concentration to have low ohmic-contact resistance to lower an operating voltage of the element and enhance element characteristics. The ohmic-contact layer 1008 may be formed of a GaN layer, a InGaN layer, a ZnO layer, or a graphene layer.

The first electrode 1009a and the second electrode 1009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like. The first electrode 1009a and the second electrode 1009b may be made of the same materials or of different materials.

The LED chip illustrated in FIG. 4 has a structure in which the first electrode 1009a and the second electrode 1009b face the same surface as a light extraction surface, but it may also be implemented to have various other structures, such as a flipchip structure in which the first electrode 1009a and the second electrode 1009b face a surface opposite to a light extraction surface, a vertical structure in which the first electrode 1009a and the second electrode 1009b are formed on mutually opposing surfaces, a vertical and horizontal structure employing an electrode structure by forming several vias in a chip as a structure for enhancing current spreading efficiency and heat dissipation efficiency, and the like.

Light Emitting Device

Second Example

Figure 5:
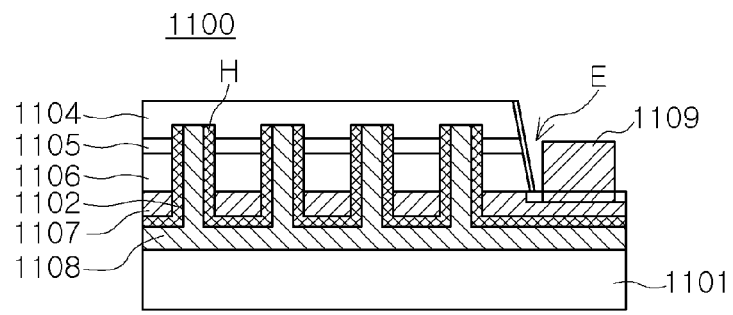
FIG. 5 is a cross-sectional view illustrating another example of an LED chip that can be employed in an exemplary embodiment.

In case of manufacturing a large light emitting device for a high output, an LED chip illustrated in FIG. 5 having a structure promoting current spreading efficiency and heat dissipation efficiency may be provided.

As illustrated in FIG. 5, the LED chip 1100 may include a first conductive semiconductor layer 1104, an active layer 1105, a second conductive semiconductor layer 1106, a second electrode layer 1107, an insulating layer 1102, a first electrode 1108, and a substrate 1101. Here, in order to be electrically connected to the first conductive semiconductor layer 1104, the first electrode layer 1108 includes one or more contact holes H extending from one surface of the first electrode layer 1108 to at least a partial region of the first conductive semiconductor layer 1104 and electrically insulated from the second conductive semiconductor layer 1106 and the active layer 1105. However, the first electrode layer 1108 is not an essential element in the present exemplary embodiment.

The contact hole H extends from an interface of the first electrode layer 1108, passing through the second electrode layer 1107, the second conductive semiconductor layer 1106, and the active layer 1105, to the interior of the first conductive semiconductor layer 1104. The contact hole H extends to at least an interface between the active layer 1105 and the first conductive semiconductor layer 1104, and may extend to a portion of the first conductive semiconductor layer 1104. However, the contact hole H is formed for electrical connectivity and current spreading, so the purpose of the presence of the contact hole H is achieved when the contact hole H is in contact with the first conductive semiconductor layer 1104. Thus, it is not necessary for the contact hole H to extend to an external surface of the first conductive semiconductor layer 1104.

The second electrode layer 1107 formed to be connected to the second conductive semiconductor layer 1106 may be selectively made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, in consideration of a light reflecting function and an ohmic-contact function with the second conductive semiconductor layer 1106, and may be formed by using a process such as sputtering, deposition, or the like.

The contact hole H may have a form penetrating the second electrode layer 1107, the second conductive semiconductor layer 1106, and the active layer 1105 so as to be connected to the first conductive semiconductor layer 1104. The contact hole H may be formed through an etching process, e.g., inductively coupled plasma-reactive ion etching (ICP-RIE), or the like.

The insulator 1102 is formed to cover a side wall of the contact hole H and a surface of the second electrode layer 1107. In this case, at least a portion of the first conductive semiconductor layer 1104 corresponding to the bottom of the contact hole H may be exposed. The insulator 1102 may be formed by depositing an insulating material such as $SiO_2$, $SiO_xN_y$, or $Si_xN_y$.

The first electrode layer 1108 including a conductive via formed by filling a conductive material is formed within the contact hole H. Subsequently, the substrate 1101 is formed on the first electrode layer 1108. In this structure, the substrate 1101 may be electrically connected by the conductive via connected to the first conductive semiconductor layer 1104.

The substrate 1101 may be made of a material such as Au, Ni, Al, Cu, W, Si, Se, GaAs, SiAl, Ge, SiC, AlN, $Al_2O_3$, GaN, or AlGaN and may be formed through a process such as plating, sputtering, deposition, bonding, or the like. But the present inventive concept is not limited thereto, and other processes may also be used.

In order to reduce contact resistance, an amount, shape, pitch, and/or contact area of the contact hole H with the first conductive semiconductor layer 1104 and the second conductive semiconductor layer 1106, and the like, may be appropriately regulated. The contact holes H may be arranged to have various shapes in rows and columns to improve a current flow. The second electrode layer 1107 may have at least one exposed region E, that is, a portion of the interface between the second electrode layer 1107 and the second conductive semiconductor layer 1106 partially externally exposed. An electrode pad 1109 connecting an external electrode to the second electrode layer 1107 may be formed on the exposed region E.

Light Emitting Device

Third Example

An LED lighting device according to the third example provides improved heat dissipation characteristics, but in the aspect of overall heat dissipation performance, the LED lighting device employs an LED chip having a low heating value. As an LED chip having a low heating value, an LED chip including a nano-structure (hereinafter, referred to as a 'nano-LED chip') may be used.

Such a nano-LED chip includes a recently developed core/shell type nano-LED chip, which has a low binding density to generate a relatively low degree of heat, has increased luminous efficiency by increasing a light emitting region by utilizing nano-structures, and prevents a degradation of efficiency due to polarization by obtaining a non-polar active layer, thus improving drop characteristics.

Figure 6:
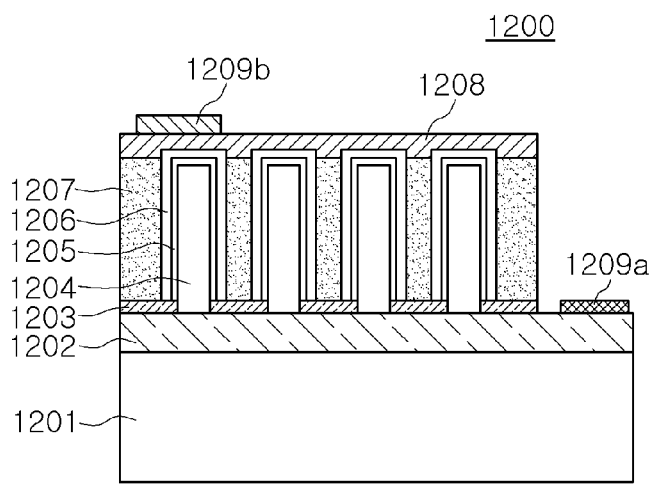
FIG. 6 is a cross-sectional view illustrating an example of an LED chip that can be employed in another exemplary embodiment.

FIG. 6 is a cross-sectional view illustrating another example of an LED chip that may be employed in the foregoing lighting device.

As illustrated in FIG. 6, a nano-LED chip 1200 includes a plurality of nano-light emitting structures formed on a substrate 1201. In this example, it is illustrated that the nano-light emitting structure has a core-shell structure as a rod structure, but the present inventive concept is not limited thereto and the nano-light emitting structure may have a different structure such as a pyramid structure.

The nano-LED chip 1200 includes a base layer 1202 formed on the substrate 1201. The base layer 1202 is a layer providing a growth surface for the nano-light emitting structure, which may be a first conductive semiconductor layer. A mask layer 1203 having an open area for the growth of the nano-light emitting structure (in particular, the core) may be formed on the base layer 1202. The mask layer 1203 may be made of a dielectric material such as $SiO_2$ or SiNx.

In the nano-light emitting structure, a first conductive nano core 1204 is formed by selectively growing a first conductive semiconductor by using the mask layer 1203 having an open area, and an active layer 1205 and a second conductive semiconductor layer 1206 are formed as shell layers on a surface of the nano core 1204. Accordingly, the nano-light emitting structure may have a core-shell structure in which the first conductive semiconductor is a nano core and the active layer 1205 and the second conductive semiconductor layer 1206 enclosing the nano core are shell layers.

The nano-LED chip 1200 includes a filler material 1207 filling spaces between the nano-light emitting structures. The filler material 1207 may also serve to structurally stabilize the nano-light emitting structures. The filler material 1207 may be made of a transparent material such as $SiO_2$, or the like, but the present exemplary embodiment is not limited thereto. An ohmic-contact layer 1208 may be formed on the nano-light emitting structures and connected to the second conductive semiconductor layer 1206. The nano-LED chip 1200 includes a first electrode 1209a and a second electrode 1209b connected to the base layer 1202 and the ohmic-contact layer 1208, respectively.

By forming the nano-light emitting structures such that the nano-light emitting structures have different diameters, components, and doping densities, light having two or more different wavelengths may be emitted from the single element. By appropriately adjusting light having different wavelengths, white light may be implemented without using phosphors in the single element, and light having various desired colors or white light having different color temperatures may be implemented by combining a different LED chip with the foregoing element or by combining wavelength conversion materials such as phosphors.

Light Emitting Device

Fourth Example

Figure 7:
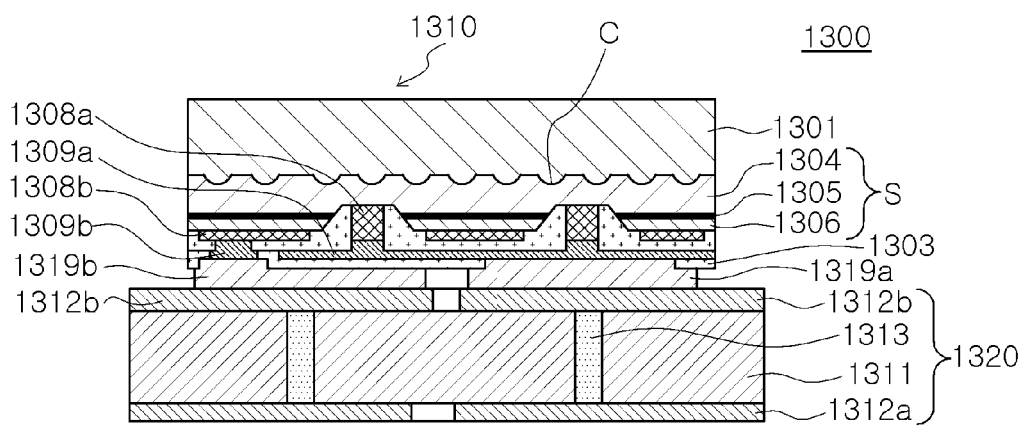
FIG. 7 is a cross-sectional view illustrating an example of an LED chip as a light emitting device that can be employed in an exemplary embodiment, which is mounted on a mounting board.

In FIG. 7, a semiconductor light emitting element having an LED chip mounted on a mounting substrate is illustrated as another example of a light source that may be employed in the foregoing lighting device.

The semiconductor light emitting element 1300 illustrated in FIG. 7 includes an LED chip 1310 mounted on a mounting substrate 1320. The LED chip 1310 is presented as an LED chip different from that of the example described above.

The LED chip 1310 includes a light emitting laminate S disposed on one surface of the substrate 1301. A first electrode 1308a and a second electrode 1308b are disposed on an opposite side of the light emitting laminate S from the substrate 1301. Also, the LED chip 1310 includes an insulating unit 1303 covering the first electrode 1308a and second electrode 1308b.

The first electrode 1308a and second electrode 1308b may include first electrode pad 1319a and second electrode pad 1319b connected thereto by electrical connection portion 1309a and exectrical connection portion 1309b, respectively.

The light emitting laminate S may include a first conductive semiconductor layer 1304, an active layer 1305, and a second conductive semiconductor layer 1306 sequentially disposed on the substrate 1301. The first electrode 1308a may be provided as a conductive via connected to the first conductive semiconductor layer 1304 through the second conductive semiconductor layer 1306 and the active layer 1305. The second electrode 1308b may be connected to the second conductive semiconductor layer 1306.

The insulating layer 1303 has an open area exposing at least portions of the first electrode 1308a and second electrode 1308b, and the first electrode pad 1319a and second electrode pad 1319b may be connected to the exposed portions of the first electrode 1308a and the second electrode 1308b, respectively.

The first electrode 1308a and second electrode 1308b may have a multilayer structure in which one or a plurality of layers made of a conductive material having ohmic characteristics with respect to the first conductive semiconductor layer 1304 and the second conductive semiconductive layer 1306, respectively, are formed. For example, the first electrode 1308a and second electrode 1308b may be formed by depositing or sputtering one or more of silver (Ag), aluminum (Al), nickel (Ni), chromium (Cr), a transparent conductive oxide (TCO), and the like. The first electrode 1308a and second electrode 1308b may be disposed in the same direction and may be mounted as a so-called flip-chip on a lead frame as described hereinafter. In this case, the first electrode 1308a and second electrode 1308b may be disposed to face in the same direction.

In particular, the first electrode 1308a may be connected to the first electrical connection portion 1309a by a conductive via connected to the first conductive semiconductor layer 1304 by passing through the second conductive semiconductor layer 1306 and the active layer 1305 within the light emitting laminate S.

An amount, shape, pitch, and/or contact area with the first conductive semiconductor layer 1304, and the like, of the conductive via and the first electrical connection portion 1309a may be appropriately regulated in order to lower contact resistance, and the conductive via and the first electrical connection portion 1309a may be arranged in a row and in a column to improve current flow.

Another electrode structure may include the second electrode 1308b directly formed on the second conductive semiconductor layer 1306 and the second electrical connection portion 1309b formed on the second electrode 1308b. In addition to having a function of forming electrical-ohmic connection with the second conductive semiconductor layer 1306, the second electrode 1308b may be made of a light reflective material, whereby, as illustrated in FIG. 7, in a state in which the LED chip 1310 is mounted as a so-called flip chip structure, light emitted from the active layer 1305 can be effectively emitted in a direction of the substrate 1301. The second electrode 1308b may be made of a light-transmissive conductive material such as a transparent conductive oxide, according to a main light emitting direction.

The two electrode structures as described above may be electrically separated by the insulating unit 1303. The insulating unit 1303 may be made of any material as long as the insulating unit 1303 has electrically insulating properties. Namely, the insulating unit 1303 may be made of any material having electrically insulating properties, and a material having a low degree of light absorption may be used. For example, a silicon oxide or a silicon nitride such as $SiO_2$, $SiO_xN_y$, $Si_xN_y$, or the like, may be used. A light reflective filler may be dispersed within the light-transmissive material to form a light reflective structure.

The first electrode pad 1319a and the second electrode pad 1319b may be connected to the first electrical connection portion 1309a and the second electrical connection portion 1309b to serve as external terminals of the LED chip 1310, respectively. For example, the first electrode pad 1319a and the second electrode pad 1319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip is mounted on the mounting substrate 1320, the first electrode pad 1319a and the second electrode pad 1319b may be bonded by using the eutectic metal, so solder bumps generally required for flip chip bonding need not be used. The use of a eutectic metal advantageously obtains superior heat dissipation effects in the mounting method as compared to the case of using solder bumps. In this case, in order to obtain excellent heat dissipation effects, the first electrode pad 1319a and the second electrode pad 1319b may be formed to occupy a relatively large area.

The substrate 1301 and the light emitting laminate S may be understood with reference to content described above with reference to FIG. 4, unless otherwise described. Also, although not shown, a buffer layer may be formed between the light emitting structure S and the substrate 1301. The buffer layer may be employed as an undoped semiconductor layer made of a nitride, or the like, to alleviate lattice defects of the light emitting structure grown thereon.

The substrate 1301 may have first and second main surfaces opposing one another, and an uneven structure (i.e., depressions and protrusions) may be formed on at least one of the first and second main surfaces. The uneven structure formed on one surface of the substrate 1301 may be formed by etching a portion of the substrate 1301 so as to be made of the same material as that of the substrate. Alternatively, the uneven structure may be made of a heterogeneous material different from that of the substrate 1301.

In the present exemplary embodiment, since the uneven structure is formed on the interface between the substrate 1301 and the first conductive semiconductor layer 1304, paths of light emitted from the active layer 1305 can be of diversity, and thus, a light absorption ratio of light absorbed within the semiconductor layer can be reduced and a light scattering ratio can be increased, increasing light extraction efficiency.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as SiO2, SiNx, $Al_2O_3$, HfO, $TiO_2$, or ZrO or the like may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present inventive concept is not limited thereto.

The substrate 1301 may be removed from the first conductive semiconductor layer 1304. To remove the substrate 1301, a laser lift-off (LLO) process using a laser, an etching or a polishing process may be used. Also, after the substrate 1301 is removed, depressions and protrusions may be formed on the surface of the first conductive semiconductor layer 1304.

As illustrated in FIG. 7, the LED chip 1310 is mounted on the mounting substrate 1320. The mounting substrate 1320 includes an upper electrode layer 1312b and a lower electrode payer 1312a formed on upper and lower surfaces of the substrate body 1311, respectively, and vias 1313 penetrating the substrate body 1311 to connect the upper electrode layer 1312b and the lower electrode payer 1312a. The substrate body 1311 may be made of a resin, a ceramic, or a metal, and the upper electrode layer 1312b or the lower electrode layer 1312a may be a metal layer made of gold (Au), copper (Cu), silver (Ag), or aluminum (Al) or the like.

The substrate on which the foregoing LED chip 1310 is mounted is not limited to the configuration of the mounting substrate 1320 illustrated in FIG. 7, and any substrate having a wiring structure for driving the LED chip 1301 may be employed. For example, it may also be provided to have a package structure in which an LED chip is mounted on a package body having a pair of lead frames.

Other Examples of Light Emitting Devices

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

Meanwhile, in the present exemplary embodiment, it is illustrated that the single light emitting device 200 is mounted on the frame unit 100, but the present inventive concept is not limited thereto. For example, a plurality of light emitting devices 200 may be provided. In this case, the light emitting devices 200 may be homogeneous light emitting devices generating light having the same wavelength, or heterogeneous light emitting devices generating light having different wavelengths, or a mixture of the two.

A wavelength conversion unit 300 is provided in the light emitting region 130, and converts a wavelength of light generated in the light emitting device 200 and emits the converted light outwardly. The wavelength conversion unit 300 may be configured such that at least a type of phosphor is dispersed in a transparent resin. Light converted by the wavelength conversion unit 300 may be mixed with light emitted from the light emitting device 200 to implement white light.

For example, the light emitting device 200 may be configured to include one or more of a light emitting element emitting white light by combining green, red, and orange phosphors to a blue LED chip and a purple, blue, green, red, and infrared light emitting element. In this case, the light emitting device 200 may have a color rendering index (CRI) adjusted to range from natrium (Na) (40) to a sunlight level (100), or the like, and have a color temperature ranging from candlelight (1500K) to a blue sky (12000K) level to generate various types of white light. The light emitting device 200 may generate visible light having purple, blue, green, red, orange colors, or infrared light to adjust an illumination color according to a surrounding atmosphere or mood. Also, the light source apparatus may generate light having a special wavelength stimulating plant growth.

White light generated by combining yellow, green, red phosphors and/or green and red LED chips and a red LED CHIP may have two or more peak wavelengths and may be positioned in a segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram. Alternatively, white light may be positioned in a region surrounded by a spectrum of black body radiation and the segment. A color temperature of white light corresponds to a range from 2000K to 20000K.

Phosphors may have the following empirical formula and colors.

Oxide system: Yellow and green $Y_3Al_5O_{12}$:Ce, $Tb_3Al_5O_{12}$:Ce, $Lu_3Al_5O_{12}$:Ce Silicate system: Yellow and green $(Ba,Sr)_2SiO_4$:Eu, yellow and orange $(Ba,Sr)_3SiO_5$:Ce Nitride system: Green β-SiAlON:Eu, yellow $L_3Si_6O_{11}$:Ce, orange α-SiAlON:Eu, red $CaAlSiN_3$:Eu, $Sr_2Si_5N_8$:Eu, $SrSiAl_4N_7$:Eu Phosphor compositions should be basically conformed with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (about 3 to 10 nm) such as CdSe, InP, or the like, a shell (about 0.5 to 2 nm) such as ZnS, ZnSe, or the like, and a ligand for stabilizing the core and the shell, and may implement various colors according to sizes.

Table 1 below shows types of phosphors in applications fields of white light emitting devices using blue LED (440 nm to 460 nm).

TABLE 1

| Purpose | Phosphors |
| --- | --- |
| LED TV BLU | β-SiAlON: Eu2+ |
|  | (Ca, Sr)AlSiN3: Eu2+ |
|  | L3Si6O11: Ce3+ |
| Lighting | Lu3Al5O12: Ce3+ |
|  | Ca-α-SiAlON: Eu2+ |
|  | L3Si6N11: Ce3+ |
|  | (Ca, Sr)AlSiN3: Eu2+ |
|  | Y3Al5O12: Ce3+ |
| Side View | Lu3Al5O12: Ce3+ |
| (Mobile, Note PC) | Ca-α-SiAlON: Eu2+ |
|  | L3Si6N11: Ce3+ |
|  | (Ca, Sr)AlSiN3: Eu2+ |
|  | Y3Al5O12: Ce3+ |
|  | (Sr, Ba, Ca, Mg)2SiO4: Eu2+ |
| Electronic device | Lu3Al5O12: Ce3+ |
| (Head Lamp, etc.) | Ca-α-SiAlON: Eu2+ |
|  | L3Si6N11: Ce3+ |
|  | (Ca, Sr)AlSiN3: Eu2+ |
|  | Y3Al5O12: Ce3+ |

The wavelength conversion unit 300 may be formed by filling the light emitting region 130 formed between the first lead frame 110 and the second lead frame 120 with a light-transmissive material such as a transparent resin containing the foregoing phosphors.

As the transparent resin, epoxy, silicon, a hybrid of epoxy and silicon, or the like, may be used and may be cured according to heating, light irradiation, a time-lapse method, or the like.

In case of silicon, polydimethyl siloxane is classified as a methyl-based silicon and polymethylphenyl siloxane is classified as a phenyl-based silicon. The methyl-based silicon and the phenyl-based silicon have differences in refractive indexes, water vapor transmission rates, light transmittance amounts, light fastness qualities, and thermostability. Also, the methyl-based silicon and the phenyl-based silicon have differences in curing speeds according to a cross linker and a catalyst, affecting phosphor distribution.

Light extraction efficiency varies according to a refractive index of a resin, and in order to minimize a gap between a refractive index of the outermost medium of a chip of a portion from which blue light is emitted and a refractive index of a portion emitted by air, two or more types of silicon having different refractive indices may be sequentially laminated.

In general, the methyl-based silicon has the highest level of thermostability, and variations in a temperature increase are reduced in order of phenyl-based silicon, hybrid silicon, and epoxy silicon. Silicon may be classified as a gel type silicon, an elastomer type silicon, and a resin type silicon according to the degree of hardness thereof.

The resin containing the foregoing phosphors may be provided to the light emitting region 130 through screen printing, for example, and may be subjected to a curing process to form the wavelength conversion unit 300.

The wavelength conversion unit 300 may have a structure parallel to one surface of the frame unit 100 and the other surface opposed thereto. Namely, the wavelength conversion unit 300 may a thickness corresponding to that of the frame unit 100 and, since the wavelength conversion unit 300 has an overall uniform structure, color coordinate dispersion can be minimized.

The reflective molding unit 400 may be formed on the frame unit 100 to cover the light emitting device 200 and the wavelength conversion unit 300. The reflective molding unit 400 may cover the light emitting device 200 to protect the light emitting device 200 from an external environment and allow light generated by the light emitting device 200 to be emitted outwardly through the wavelength conversion unit 300.

The reflective molding unit 400 may be made of a resin such as silicon containing a reflective material. The reflective material may include $TiO_2$, or the like. Also, the reflective molding unit 400 may be formed of an epoxy molding compound (EMC) having a high degree of light reflectivity.

An outer surface of the reflective molding unit 400 may be coplanar with the circumference of edges of the frame unit 100 and may be provided on one surface of the frame unit 100. Thus, the frame unit 100 is exposed from the reflective molding unit 400 in a direction of one surface of the reflective molding unit 400, and exposed from the circumference of the outer surface of the reflective molding unit 400 in the entire directions. Through this structure, the light emitting device package 100 according to the present exemplary embodiment may be mounted in various manners, increasing a degree of freedom in designing.

The reflective molding unit 400 may be formed by injecting a resin containing a reflective material onto the frame unit 100 and curing the same. Also, the reflective molding unit 400 may be formed by curing a portion of a surface thereof in contact with the frame unit 100 and bonding the same.

Figure 8A:
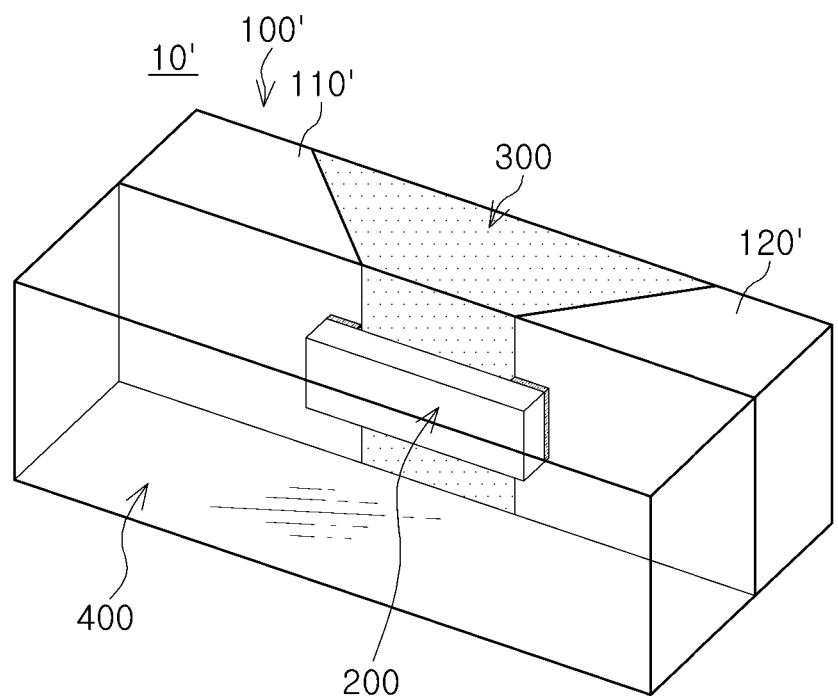
FIGS. 8A and 8B are a perspective view and a cross-sectional view illustrating a modification of the light emitting device package of FIG. 1.
Figure 8B:
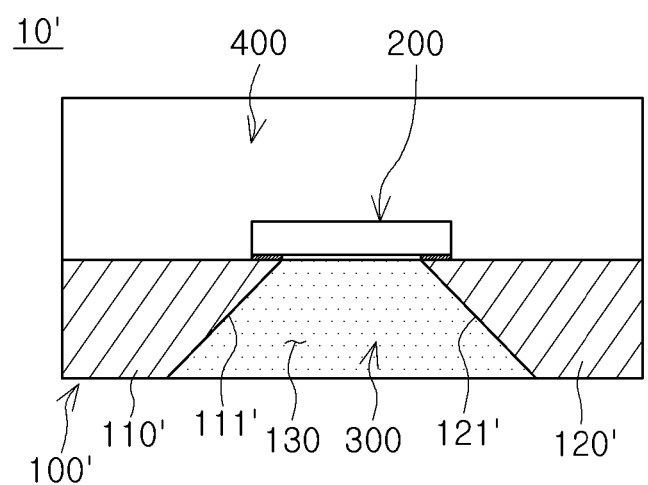

FIG. 8 schematically illustrates a modification of the light emitting device package of FIG. 1. FIGS. 8A and 8B are a perspective view and a cross-sectional view illustrating a modification of the light emitting device package of FIG. 1.

Components constituting a light emitting device package 10' according to the modification illustrated in FIG. 8 are substantially the same as those of the exemplary embodiment illustrated in FIG. 1 in a basic structure, except for a structure of a frame unit 100' forming the light emitting region 130.

In detail, as illustrated in FIG. 8, the frame unit 100' may have a structure in which inner surfaces 111' and 121' of the first lead frame 110' and the second lead frame 120', respectively, are sloped to become gradually distant in a direction from one surface on which the light emitting device 200 is mounted to the other surface opposed to the one surface.

The slopes of the inner surfaces 111' and 121' provide for a wider light emitting region 130, and accordingly light emitting outwardly through the light emitting region 130 through the sloped structure may be irradiated in a wider range, thus increasing light extraction efficiency. Also, an irradiation range of light irradiated outwardly may be adjusted by regulating a slope angle.

Figure 9A:
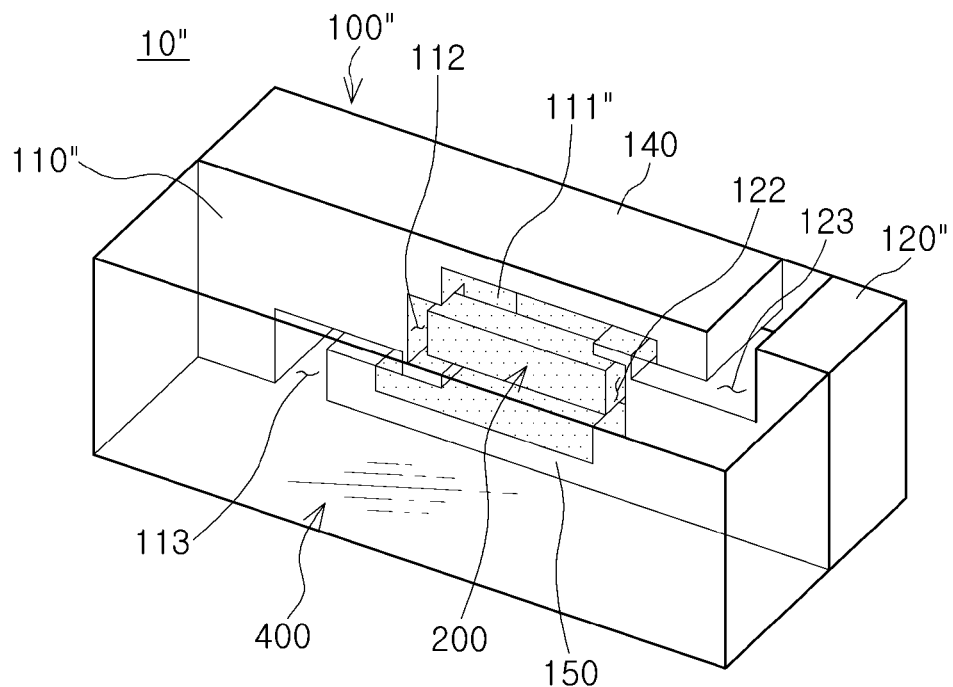
FIGS. 9A and 9B are perspective views schematically illustrating a light emitting device package according to another exemplary embodiment.
Figure 9B:
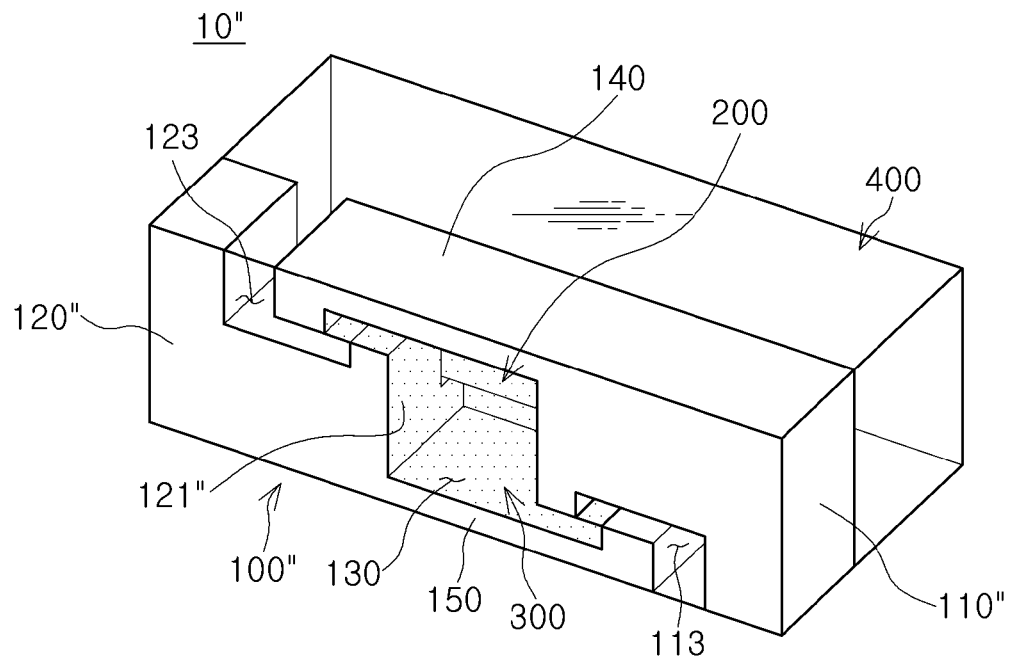
Figure 10:
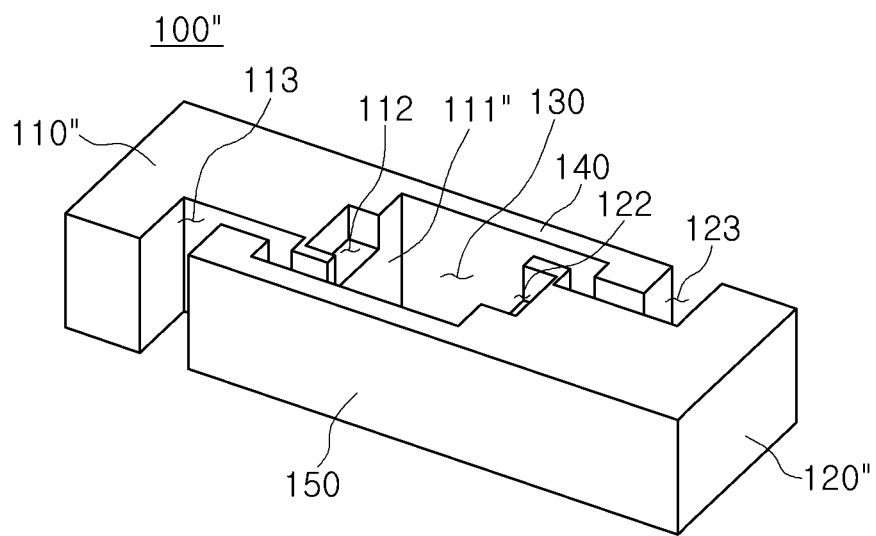
FIG. 10 is a perspective view schematically illustrating a frame unit of the light emitting device package of FIG. 9.

A light emitting device package according to another exemplary embodiment will be described with reference to FIGS. 9 and 10. FIGS. 9A and 9B are perspective views schematically illustrating a light emitting device package according to another exemplary embodiment. FIG. 10 is a perspective view schematically illustrating the frame unit of the light emitting device package of FIG. 9.

Components constituting the light emitting device package according to the exemplary embodiment illustrated in FIGS. 9 and 10 are basically substantially the same as those of the exemplary embodiment illustrated in FIGS. 1 through 8, except for the structure of the frame unit. Thus, hereinafter, descriptions of the same components as those of the former exemplary embodiment will be omitted and only the frame unit will be described.

As illustrated in FIGS. 9 and 10, a frame unit 100'' may include a mounting recess 112 and a mounting recess 122 formed to be depressed in a first lead frame 110'' and a second lead frame 120'', respectively, on which the light emitting device 200 is mounted. The first lead frame 110'' has an extended frame portion 140, and the second lead frame 120" has an extended frame portion 150.

The mounting recess 112 and the mounting recess 122 are formed such that one surface of the first lead frame 110" and the second lead frame 120" are connected to inner surfaces 111" and 121", respectively, and a distance between the mounting recess 112 and the mounting recess 122 may be greater than a width of the light emitting device 200 such that a gap exists between the mounting recess 112 and the light emitting device 200, and between the mounting recess 122 and the light emitting device 200. FIGS. 9A and 9B show that the light emitting device 200 is generally centered in the gap; however, the present inventive concept is not limited to this and the light emitting device 200 may be skewed to one side or the other such that the gaps on either side of the light emitting device 200 are not equal.

The gap may be filled with the wavelength conversion unit 300, and one surface (main light emitting surface) of the light emitting device 200 facing the light emitting region and the circumference of the lateral surfaces thereof may be surrounded by the wavelength conversion unit 300.

The extended frame portions 140 and 150 may be disposed to be parallel along both lateral surfaces facing one another with the light emitting device 200 interposed therebetween, and may extend such that the extended frame portions 140 and 150 are not in contact with other lead frames positioned in the extending direction.

The extended frame portions 140 and 150 may extend a distance that is greater than a distance between the lead frames 110" and 120". Moreover, ends of the extending portions may be bent toward the other lead frames 110" and 120". That is, an end of the extended frame portion 140 may be bent toward the lead frame 120" and an end of the extended frame portion 150 may be bent toward the lead frame 110".

The lead frames 110" and 120" may have recesses 113 and 123 accommodating the ends of the extended frame portions 150 and 140, respectively. That is, the extended frame portions 140 and 150 are configured so as to fit together in a "hand-in-hand" interlocking type of arrangement. The recesses 113 and 123 may have a structure corresponding to the bent structures of the ends of the extended frame portions and may have an interval with regard to the extended frame portions, for electrical insulation therebetween. The spaces between the recesses 113 and 123 and the extending portions may be filled with the reflective molding unit 400.

The extended frame portions 140 and 150 may surround the lateral surfaces of the light emitting device 200 together with the mounting recesses 112 and 122, preventing lateral light leakage. Namely, in the structure illustrated in FIG. 1, since both lateral surfaces of the light emitting region 130 perpendicular to the lead frames 110 and 120 are open to be exposed outwardly, causing a lateral light leakage phenomenon in which light is leaked laterally. The lateral light leakage phenomenon may degrade light extraction efficiency when light is intended to be irradiated in a particular direction.

In comparison, in the light emitting device package 10" according to the present exemplary embodiment, the opened lateral surfaces of the light emitting region 130 are blocked by the extended frame portions 140 and 150, preventing such a lateral light leakage phenomenon. Also, since the ends of the extended frame portions 140 and 150 are bent, the light extraction region 130 (see FIG. 9B) can be filled with a resin for the formation of the wavelength conversion unit 300 by virtue of the bent paths, without spreading the resin to the recesses 113 and 123.

Figure 11:
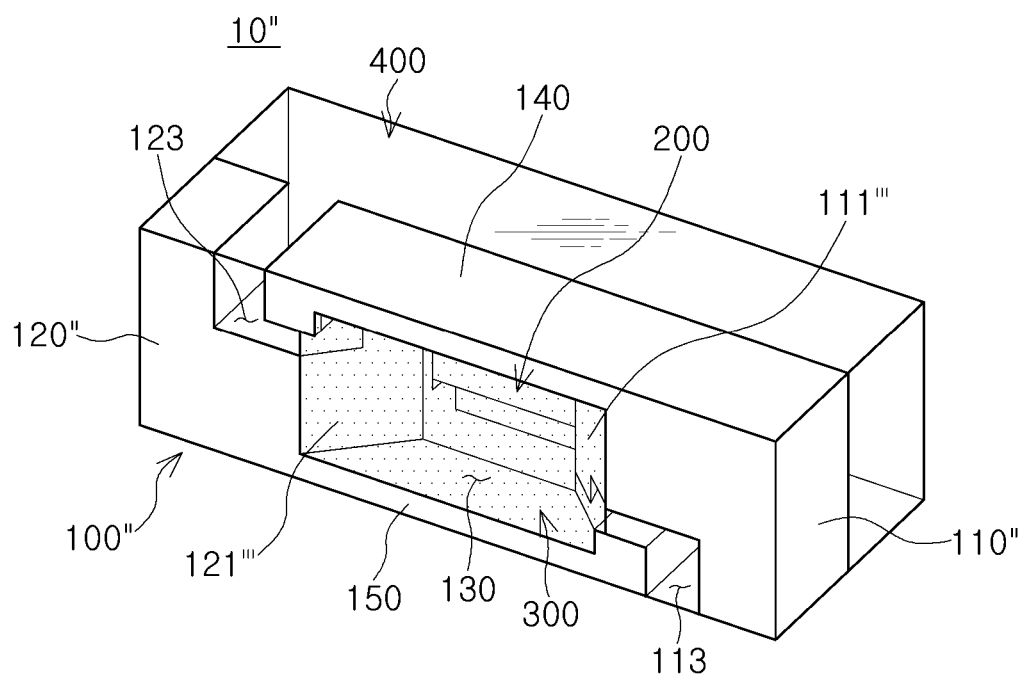
FIG. 11 is a perspective view schematically illustrating a modification of the light emitting device package of FIG. 9.

FIG. 11 schematically illustrates a modification of the light emitting device package of FIGS. 9 and 10. Components constituting the light emitting device package 10" according to the modification illustrated in FIG. 11 are basically substantially the same as those of the exemplary embodiment illustrated in FIGS. 9 and 10, except for a structure of a frame unit 100" constituting the light emitting region 130.

In detail, as illustrated in FIG. 11, the frame unit 100" may have a structure in which inner surfaces 111''' and 121''' of lead frames 110" and 120", respectively, constituting the light emitting region 130 and facing each other are sloped to become gradually distant in a direction from one surface on which the light emitting device 200 is mounted to the other surface opposed to the one surface. Namely, the inner surfaces 111''' and 121''' have a similar structure as that of the inner surfaces 111' and 121' illustrated in FIG. 8.

A method for manufacturing a light emitting device package according to an exemplary embodiment will be described with reference to FIGS. 12A through 16. FIGS. 12A through 16 are cross-sectional views schematically illustrating processes of the method for manufacturing a light emitting device package according to an exemplary embodiment.

Figure 12A:
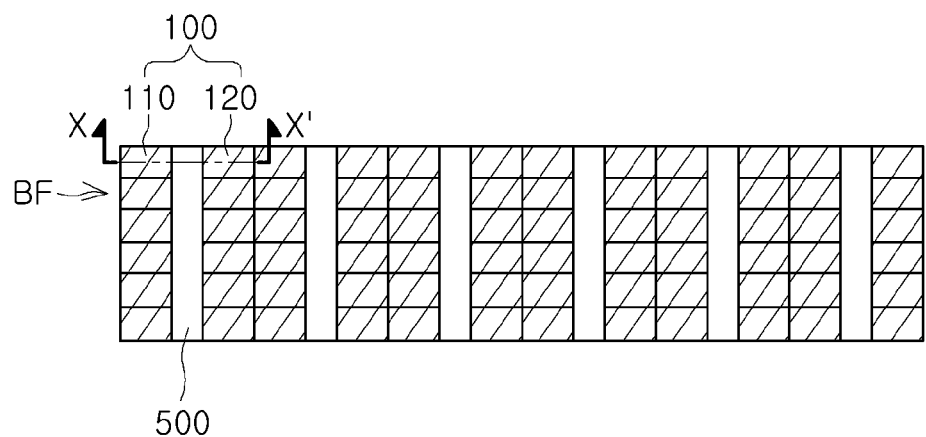
FIGS. 12A through 16 are cross-sectional views schematically illustrating processes of a method for manufacturing a light emitting device package according to an exemplary embodiment.

As illustrated in FIG. 12A, a base frame BF in which a plurality of frame units 100, each including a first lead frame 110 and a second lead frame 120 facing one another and spaced apart from one another are arranged is prepared. The plurality of frame units 100 may be arranged in rows and columns, forming a matrix structure.

The base frame BF including the plurality of arranged frame units 100 may be collectively formed by performing pressing on a single metal plate, but the exemplary embodiment is not limited thereto.

Figure 12B:
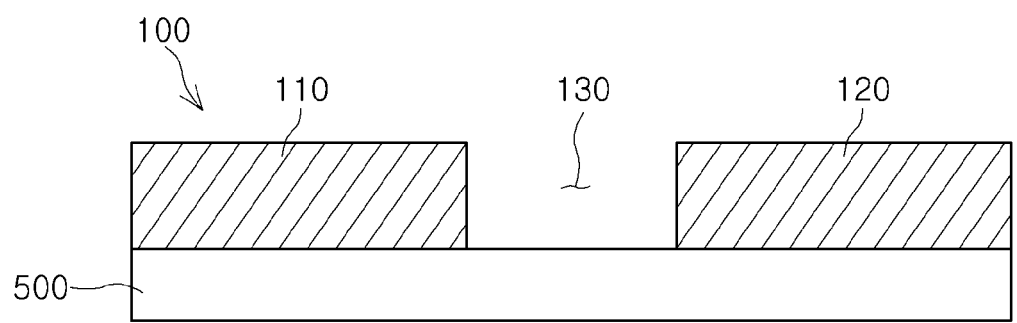

Thereafter, a temporary fixing film 500 is attached to a lower surface of the base frame BF. FIG. 12B schematically illustrates a cross-section of the frame unit 100 taken along line X-X' in FIG. 12A. As illustrated in FIGS. 12A and 12B, the temporary fixing film 500 supports the base frame BF and serves to block one opened surface of the light emitting region 130 defined by the distance between the first lead frame 110 and the second lead frame 120. Thus, the light emitting region 130 between the first lead frame 110 and the second lead frame 120 has a cup-like structure, rather than a through hole structure.

Figure 13A:
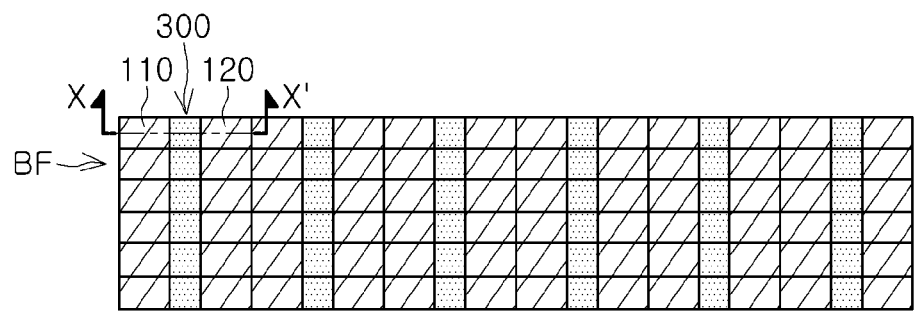
Figure 13B:
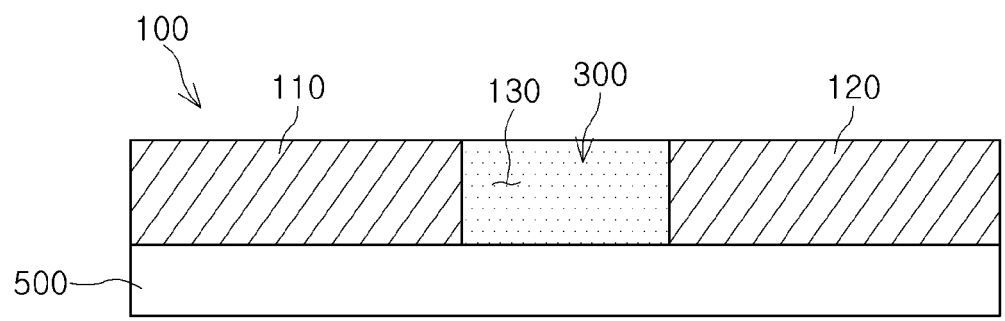

Thereafter, as illustrated in FIGS. 13A and 13B, the wavelength conversion unit 300 is formed in the light emitting region 130 defined by the distance between the first lead frame 110 and the second lead frame 120.

In detail, the light emitting region 130 formed in the plurality of frame units 100 may be collectively filled with a light-transmissive material such as a transparent resin containing phosphors through a screen printing method to simultaneously form the wavelength conversion unit 300 in each of the plurality of frame units 100.

FIG. 13B schematically illustrates a cross-section of the frame unit 100 taken along line X-X' in FIG. 13A. As illustrated in FIG. 13B, the wavelength conversion unit 300 may have a thickness corresponding to that of the frame unit 100 and the thickness of the wavelength conversion unit 300 may be uniform overall.

Figure 14A:
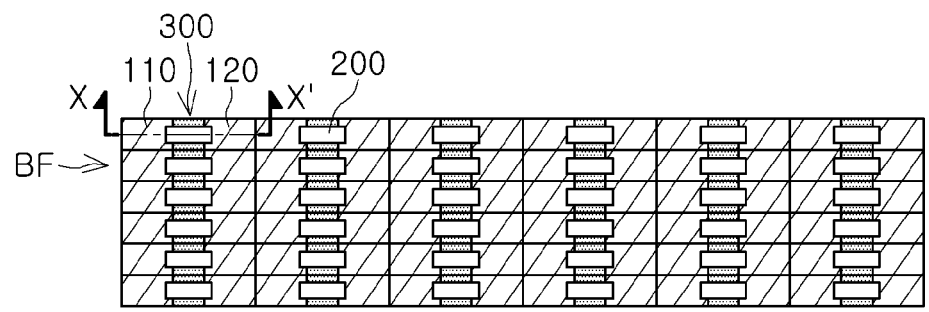
Figure 14B:
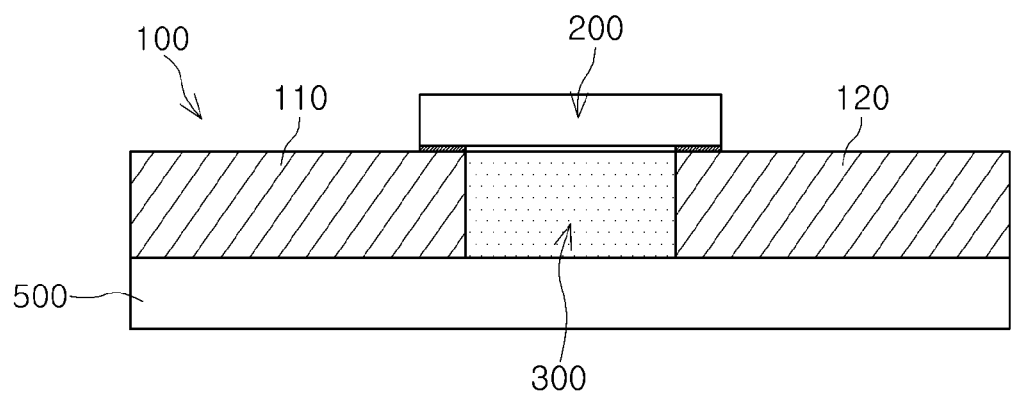

Thereafter, as illustrated in FIGS. 14A and 14B, the light emitting device 200 is mounted on one surface of each of the first lead frame 110 and the second lead frame 120, traversing the light emitting region 130. As discussed above, while the light emitting device 200 is shown in FIG. 14B to be generally centered with respect to the light emitting region 130, the present exemplary embodiment is not limited to this, and the light emitting device 200 may be skewed more to one side of the other.

Portions of each end of the light emitting device 200 are supportively bonded to the first lead frame 110 and the second lead frame 120, respectively, and may be electrically connected thereto according to a flipchip bonding scheme. In the present exemplary embodiment, the structure in which the light emitting device is connected according to the flipchip bonding scheme is illustrated, but the present exemplary embodiment is not limited thereto. For example, the light emitting device 200 may be electrically connected to the first lead frame 110 and the second lead frame 120 through wire bonding.

Figure 15:
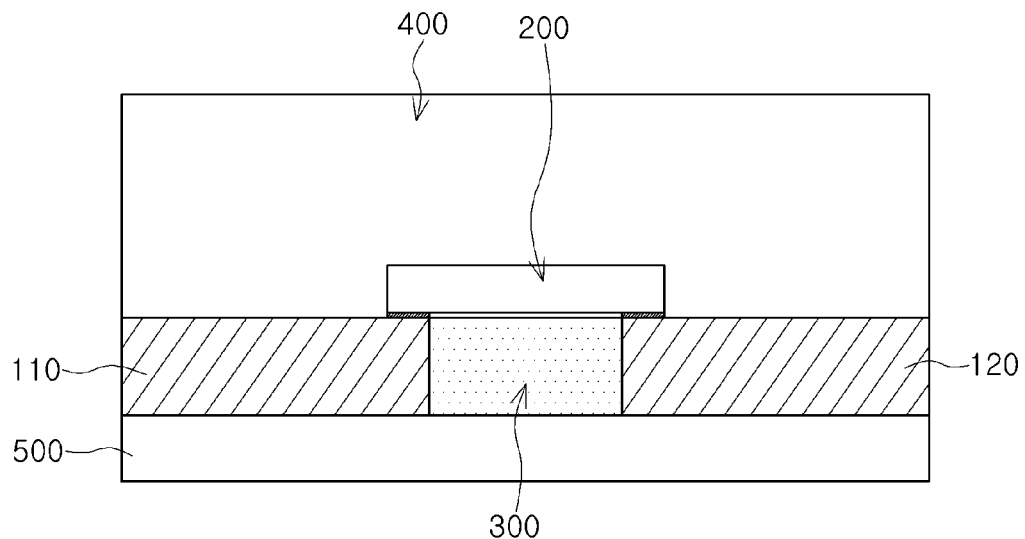

Thereafter, as illustrated in FIG. 15, the reflective molding unit 400 is formed on the frame unit 100 to cover the light emitting device 200.

The reflective molding unit 400 may be made of a resin such as silicon containing a reflective material. Also, the reflective molding unit 400 may be formed of an epoxy molding compound (EMC) having a high degree of light reflectivity.

The reflective molding unit 400 may be formed by injecting a resin containing a reflective material onto the frame unit 100 and curing the same. Alternatively, the reflective molding unit 400 may be formed by curing a portion of a surface thereof in contact with the frame unit 100 and bonding the same.

Figure 16:
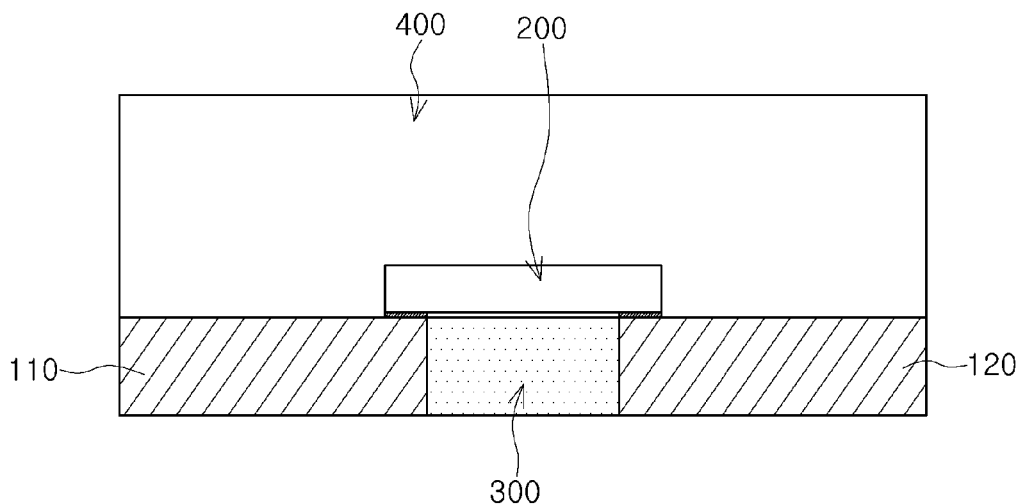

Thereafter, as illustrated in FIG. 16, the temporary fixing film 500 is removed. The base frame BF is diced by frame units 100 to manufacture individual light emitting device packages.

The temporary fixing film 500 may be removed any time after the formation of the wavelength conversion unit 300. Thus, after the individual light emitting device packages are manufactured through dicing, the temporary fixing film 500 may be removed by individual light emitting device packages.

The light emitting device package 10 manufactured thusly has the structure in which the wavelength conversion unit 300 has a uniform thickness overall, advantageously minimizing a color coordinate dispersion, relative to the conventional package structure in which a reflective cup is filled with phosphors.

Also, since the package size is determined by the sizes of the frame unit 100 and the reflective molding unit 400, the package can be manufactured as being thinner.

Figure 17A:
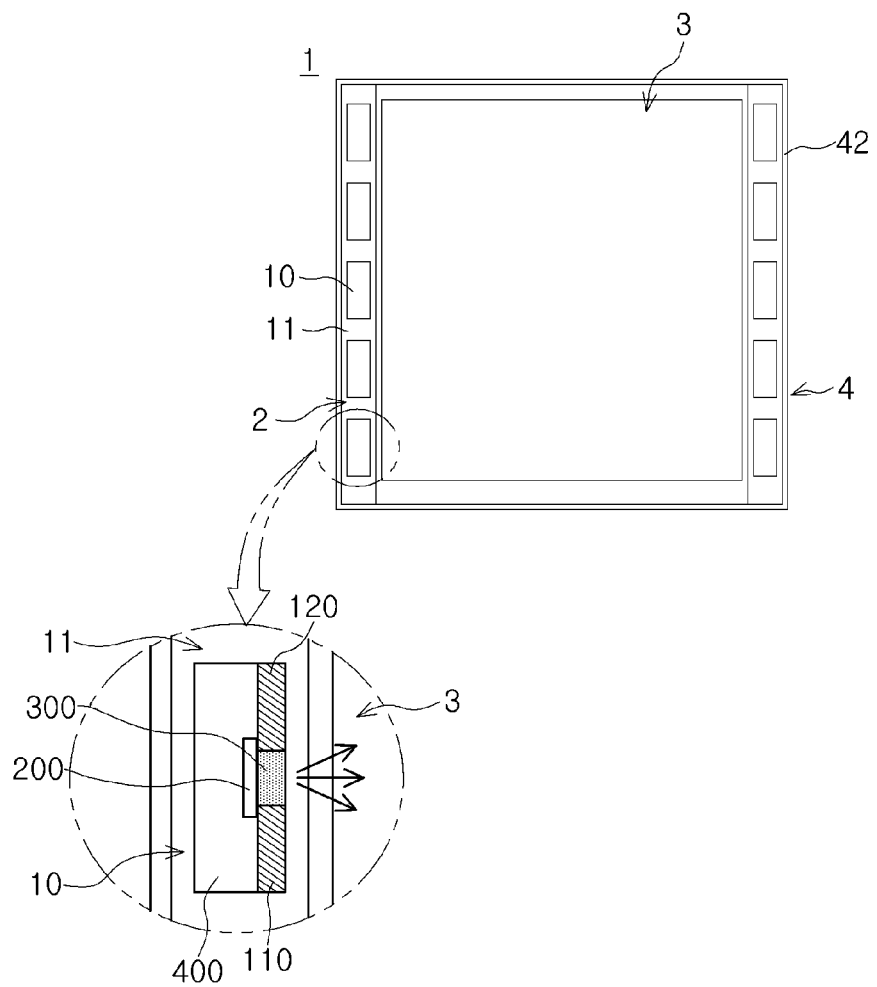
FIGS. 17A and 17B are a plan view and a cross-sectional view schematically illustrating a backlight unit employing a light emitting device package according to an exemplary embodiment.
Figure 17B:
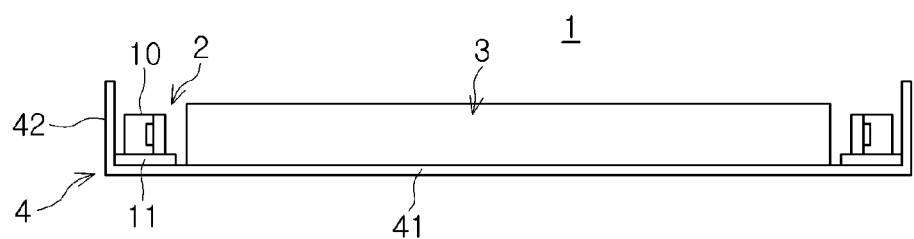

FIGS. 17A and 17B schematically illustrate a backlight unit employing the foregoing light emitting device package according to an exemplary embodiment. The backlight unit 1 illustrated in FIGS. 17A and 17B may include a light source 2 configured as the light emitting device package 10 disposed on a board 11, a light guide plate 3, and a bottom chassis 4.

The bottom chassis 4, a type of support member in which the light source 2 and the light guide plate 3 are fixedly installed, may be made of metal. The bottom chassis 4 may have a box-like structure having a bottom surface 41 and side walls 42 extending upwardly from edges of the bottom surface 41. (See FIG. 17B).

The light guide plate 3 may be made of a light-transmissive material and guide light irradiated from the light source 2 to emit light toward a display device disposed thereabove.

The light source 2 may be disposed to be adjacent to one lateral surface of the light guide plate 3 and emits light to the lateral surface of the light guide. The irradiated light may be made incident to the interior of the light guide plate through the lateral surface of the light guide plate 3.

The light source 2 may include the board 11 mounted on the bottom surface 41 of the bottom chassis 4 and a plurality of light emitting device packages 10 arranged on the board 11. The light emitting device package 10 may be the light emitting device package illustrated in any of the FIGS. 1 through 11, and detailed description thereof will be omitted.

Since the light emitting device package 10 has the structure in which the lateral surface of the reflective molding unit 400 and that of the frame unit 100 are coplanar and exposed to the outside, when the light emitting device package 10 is mounted on the board 11 as a side-view type light emitting device package, the light emitting device package 10 can be directly electrically connected through the exposed lateral surface of the frame unit 100. Thus, there is no need to additionally provide an electrode pad.

Also, since a process of bending a lead frame to a lateral surface of a package body mounted on a board and disposing the same, as in the related art side-view type package, is omitted, the manufacturing process, as well as the overall package structure, can be simplified.

As set forth above, according to exemplary embodiments, the light emitting device package having a relatively simple structure, incurring low manufacturing costs, and having a phosphor layer with a uniform thickness, and a manufacturing method thereof can be provided.

Advantages and effects of the exemplary embodiments are not limited to the foregoing content and any other technical effects not mentioned herein may be easily understood by a person skilled in the art from the foregoing description.

While exemplary embodiments have been shown and described, it will be apparent to those skilled in the art that modifications and variations can be made without departing from the spirit and scope of the inventive concept as defined by the appended claims.

What is claimed is:

1. A light emitting device package comprising:
  a frame unit comprising at least two lead frames spaced apart from one another and a light emitting region defined by a distance between the lead frames;
  a light emitting device that is mounted on a surface of the frame unit such that the light emitting device is positioned across the light emitting region, and that is electrically connected to the lead frames;
  a wavelength conversion unit configured to convert a wavelength of light emitted from the light emitting device and emit the light having the converted wavelength externally; and
  a reflective molding unit that is formed on the surface of the frame unit to cover the light emitting device,
  wherein an outer surface of the reflective molding unit is coplanar with a circumferential surface of the frame unit.

2. The light emitting device package of claim 1, wherein the wavelength conversion unit is provided in the light emitting region and is formed to be parallel to the surface of the frame unit and to another surface of the frame unit opposed to the surface of the frame unit.

3. The light emitting device package of claim 1, wherein the reflective molding unit is made of a resin comprising a reflective material.

4. The light emitting device package of claim 1, wherein an inner surface, that faces the light emitting region, of each of the at least two lead frames is sloped away from the light emitting region from the surface on which the light emitting device is mounted to another surface opposed to the surface.

5. The light emitting device package of claim 1, wherein the frame unit further comprises a mounting recess that is formed in each of the at least two lead frames, the mounting recess being depressed into the lead frame and the light emitting device being mounted to the mounting recesses.

6. The light emitting device package of claim 1, wherein each of the at least two lead frames comprises an extended frame portion that extends from the lead frame in an extending direction.

7. The light emitting device package of claim 6, wherein the extended frame portions are disposed to be parallel to each other with the light emitting device interposed therebetween, and the extended frame portions are not in contact with other lead frames positioned in the extending direction.

8. The light emitting device package of claim 6, wherein the extended frame portions extend parallel to each other and each of the extended frame portions has an end portion that extends further than a width of the light emitting device interposed therebetween, and each lead frame further comprises a recess that accommodates the end portion of another lead frame that extends parallel thereto.

9. The light emitting device package of claim 8, wherein the end portion of each lead frame is bent toward the recess of the another lead frame that extends parallel thereto, and a portion of each recess comprises electrical insulation.

10. A light emitting device package comprising:
a first lead frame;
a second lead frame spaced apart from the first lead frame to form a light emitting region in a gap therebetween;
a light emitting device that is mounted and electrically connected to the first lead frame and to the second lead frame such that the light emitting device is positioned across the light emitting region;
a wavelength conversion unit that is formed in the light emitting region and that converts a wavelength of light emitted from the light emitting device and emits the light having the converted wavelength; and
a reflective molding unit that is formed on the first lead frame and the second lead frame to completely cover the light emitting device, the first lead frame, and the second lead frame.

11. The light emitting device package of claim 10, wherein the reflective molding unit is made of a resin comprising a reflective material.

12. The light emitting device package of claim 10, wherein:
an inner surface of the first lead frame that forms the gap is sloped from a surface of the first lead frame on which the light emitting device is mounted toward an outer surface of the light emitting device package, and
an inner surface of the second lead frame that forms the gap is sloped from a surface of the second lead frame on which the light emitting device is mounted toward the outer surface of the light emitting device package.

13. The light emitting device package of claim 10, wherein:
the first lead frame comprises a first mounting recess that is depressed into the first lead frame and in which a first end of the light emitting device is mounted, and
the second lead frame comprises a second mounting recess that is depressed into the second lead frame and in which a second end of the light emitting device is mounted.

14. The light emitting device package of claim 10, wherein:
the first lead frame comprises a first extended frame portion that extends across the light emitting region and overlaps the second lead frame,
the second lead frame comprises a second extended frame portion that extends across the light emitting region and overlaps the first lead frame,
the first lead frame comprises a first recess,
the second lead frame comprises a second recess,
an end of the first extended frame portion that overlaps the second frame is bent toward the second recess and is received by the second recess, and
an end of the second extended frame portion that overlaps the first lead frame is bent toward the first recess and is received by the first recess.

15. The light emitting device package of claim 1, wherein the circumferential surface of the frame unit is polygonal.

16. The light emitting device package of claim 1, wherein the circumferential surface of the frame unit is rectangular.

17. The light emitting device package of claim 1, wherein the circumferential surface of the frame unit is circular.

* * * * *